United States Patent [19]
Blaum et al.

[11] Patent Number: 5,579,475
[45] Date of Patent: Nov. 26, 1996

[54] METHOD AND MEANS FOR ENCODING AND REBUILDING THE DATA CONTENTS OF UP TO TWO UNAVAILABLE DASDS IN A DASD ARRAY USING SIMPLE NON-RECURSIVE DIAGONAL AND ROW PARITY

[75] Inventors: Miguel M. Blaum; James T. Brady, both of San Jose; Jehoshua Bruck, Palo Alto; Jaishankar M. Menon, San Jose, all of Calif.

[73] Assignee: International Business Machines Corporation, Armonk, N.Y.

[21] Appl. No.: 518,955

[22] Filed: Aug. 24, 1995

Related U.S. Application Data

[63] Continuation of Ser. No. 85,707, Jun. 30, 1993, abandoned, which is a continuation-in-part of Ser. No. 653,596, Feb. 11, 1991, Pat. No. 5,271,012, and Ser. No. 718,724, Jun. 21, 1991, abandoned.

[51] Int. Cl.$^6$ ................................................ G06F 11/34
[52] U.S. Cl. ........................... 395/182.05; 371/40.1; 371/49.3
[58] Field of Search ........................... 371/10.1, 10.2, 371/37.4, 50.1, 51.1, 40.1, 40.4, 2.1, 37.1, 37.6, 38.1, 37.7, 49.1, 49.3; 395/182.05

[56] References Cited

U.S. PATENT DOCUMENTS

| | | | |
|---|---|---|---|
| 3,685,016 | 8/1972 | Eachus | 340/146.1 |
| 4,092,732 | 5/1978 | Ouchi | 364/900 |
| 4,201,976 | 6/1980 | Patel | 371/50 |
| 4,775,978 | 10/1988 | Hartness | 371/38 |
| 4,914,656 | 4/1990 | Dunphy et al. | 371/10.2 |
| 5,130,992 | 7/1992 | Prey, Jr. et al. | 371/40.1 |
| 5,271,012 | 12/1993 | Blaum et al. | 371/101 |

OTHER PUBLICATIONS

"A Case For Redundant Arrays of Inexpensive Disks (RAID)" Report No. UCB/CSD 87/391, Dec. 1987 Computer Science Division U. of California, Berkeley.

*Primary Examiner*—Robert W. Beausoliel, Jr.
*Assistant Examiner*—Phung My Chung
*Attorney, Agent, or Firm*—Baker, Maxham, Jester & Meador

[57] ABSTRACT

The data contents of up to two concurrently failed or erased DASDs can be reconstituted where the data is distributed across M DASDs as an (M−1)*M block array and where (1) the (M−1)st DASD contains the simple parity taken over each of the array diagonals in diagonal major order in the same mode (odd/even) as that exhibited by the major diagonal of the array and (2) where the M-th DASD contains the simple even parity over each of the rows in row major order. Relatedly, short write updates require fewer operations for data blocks located off the major data array diagonal.

10 Claims, 7 Drawing Sheets

PARITY CODING AND REBUILD IN THE EVENT OF FAILED DASDS

ELEMENTS OF A DASD ARRAY

DECODING

DECODING

PARITY CODING AND REBUILD IN THE EVENT OF FAILED DASDS

METHOD AND MEANS FOR ENCODING AND REBUILDING THE DATA CONTENTS OF UP TO TWO UNAVAILABLE DASDS IN A DASD ARRAY USING SIMPLE NON-RECURSIVE DIAGONAL AND ROW PARITY

This application is a file wrapper continuation of application Ser. No. 08/085,707, filed Jun. 30, 1993, now abandoned, which is a CONTINUATION-IN-PART per 35 USC 120 of copending applications U.S. Ser. No.: 07/653,596, filed Feb. 11, 1991, and of U.S. Ser. No.: 07/718,724, filed Jun. 21, 1991.

FIELD OF THE INVENTION

This invention relates to arrays of failure independent direct access storage devices (DASDs), and more particularly, to maintaining availability of data stored on said DASD arrays even where up to two DASDs in the array are concurrently rendered unavailable as by erasure of their contents.

DESCRIPTION OF RELATED ART

In the prior art, the spreading of data blocks across DASD arrays to enhance access, data rate, fault tolerance, and recovery of array stored data blocks has been well appreciated. Of particular interest, is the use of simple parity for the correction of single DASD failures or erasures (Ouchi) and the use of more complex redundancy codes to correct up to two (Blaum I, II) or even three (Blaum III) concurrent failures. In order to return DASD array operation from a degraded mode upon the occurrence of failure to a fault tolerant mode, it is known to employ some DASDs as hot spares (Dunphy) which can be switched in to replace failed DUDs and be available to store rebuilds of the missing or erased data. It is also known to reserve spare space (Mattson I) among the DASDs of an array equivalent to some number of DASDs which might be expected to fail so as to maintain availability even though array operation would continue in a degraded mode or to effectuate load balancing (Mattson II).

Striping and Parity Encoding Records Over DASD Arrays and Recovery from Single DASD Failure By Modulo 2 Addition Ouchi, U.S. Pat. No. 4,092,732, "System for Recovering Data Stored in a Failed Memory Unit", issued May 30, 1978, discloses the spreading of data blocks from the same logical file across a string of N−1 failure independent DASDs and recording a parity block on the Nth DASD. According to Ouchi, the parity block is an XORing of the contents of the N−1 other blocks. Contents from any single inaccessible DASD can be recovered by XORing the parity blocks with the blocks stored on the N−2 remaining accessible DASDs. In the event of a single failure, Ouchi is operated in a degraded mode since any additional failure until a spare disk is reconstituted would render the subsystem totally unavailable. This feature was later re described in Hartness, U.S. Pat. No. 4,775,978, "Data Error Correction System", issued Oct. 4, 1988.

In an Ouchi type array, correction of blocks requires identification of failed DASDs. This can be achieved by Hamming codes. However, such codes are usually used on a bit rather than block interleaved DASD array and the number of DASDs dedicated to redundancy is a significant fraction of the total as reported by Patterson et al, "A Case For Redundant Arrays Of Inexpensive Disks (RAID)", Report No. UCB/CSD 87/391, Deccember 1987, Computer Science Division, U. of California, Berkeley.

In contrast, block interleave and simple parity coding as set forth in Ouchi permit a near infinite parity domain or striping width and only one redundant DASD need be involved. However, the identification of any failed DASD must be obtained independently such as by threshold ECC retry or equivalent. Reference should also be made to Dunphy et al, U.S. Pat. No. 4,914,656, "Disk Drive Memory", issued Apr. 3, 1990.

Data Availability, Hot Sparing, and Spare Space

The fastest recovery from DASD failure is to electronically switch to a completely duplicated or mirrored data set stored on a second storage domain. This obviously doubles storage costs. DASD arrays, as described by Ouchi and Dunphy, assume that the probability of a single DASD failure in an array is high while that of concurrent DASD failure is low. Further, in order to return a system having had a single failure back to fault tolerant state, hot sparing should be used.

Hot sparing, as defined by Dunphy, involves reserving one or more DASDs, substituting a spare to a domain after a DASD within that domain has failed, and rebuilding the otherwise unavailable blocks onto the spare. As long as the DASD failures are not nested within the interval defined by DASD failure and the completion of rebuilding data onto the spare, then the mean time between data unavailability can be very long indeed. Further, single DASD correction+sparing per Ouchi and Dunphy keep the number of idle or redundant DASDs to a minimum.

An alternative to hot sparing is to reserve space on some patterned basis among the array DASDs equal to some number of failed DASDS for purposes either of maintaining availability even when operating in degraded mode or to assist load balancing especially in respect of sequential write updates. This is described in copending applications, Mattson et al, SA9-90-079, U.S. Ser. No.: 07/714,969, filed Jun. 13, 1991, "Method and Means for Distributed Sparing in DASD Arrays", or Mattson et al, SA9-90-020, U.S. Ser. No.: 07/562,188, filed Aug. 3, 1990, "Method and Means for Managing DASD Array Accesses When Operating in Degraded Mode".

Array Data Rebuild for Up to Two DASD Failures

Copending application Blaum et al (Blaum I), U.S. Ser. No.: 07/653,596, filed Feb. 11, 1991, "Method and Means for Encoding and Rebuilding the Data Contents of Up to Two Unavailable DASDs in an Array of DASDs" teaches a method for coding and rebuilding (M−1)*M symbol array onto an M synchronous DASD array when up to two DASDs fail, M being a prime number. Pairs of simple parities are recursively coded in respective diagonal major and intersecting row major order data array directions covering a topological torus. Rebuilding data upon unavailability of no more than two DASDs requires a requires a simple recursive operation similar to the encoding step, and involving exclusive-OR operations only.

The coding (either encoding or rebuilding) in Blaum I involves repeatedly alternating a diagonal parity assignment with a row parity assignment in zig/zag fashion so as to cover the entire (M−1)*M data array according to a deterministic process. Each of the M diagonal parity assignments involves XORing M−2 data elements and placing the result in a first parity position. This is followed by XORing of the M−1 data elements of the row intersecting the first parity position and placing the result in a second parity position in that row.

Copending application Blaum et al (Blaum II), SA9-91-051, U.S. Ser. No.: 07/751,950, filed Aug. 29, 1991, "Method and Means For B-Adjacent Coding and Rebuilding Data From Up to Two Unavailable DASDS in a DASD Array" discloses a method and means for correcting portions of a data string stored on up to two unavailable DASDs in a DASD array using B-adjacent coding. In Blaum II, the method steps comprise (a) independent identification of the failed DASDs and (b) formation and resolution of a pair of syndromes obtained from the blocks of the same string on the remaining DASDs. The syndrome pair (S(0),S(1)) consist of two independent Boolean equations in two unknowns.

In Blaum II, each data string is segmented into N data blocks+2 redundant blocks and then written across N counterpart DASDs. The redundant blocks (R(0) ,R(1)) are computed over the string. The first redundant block, R(0), is the XOR of N–2 data blocks while the second redundant block, R(1), is the modulo 2 sum of the products of a primitive element in a finite field (Galois field) raised to a declining power (a5(N–i)) and the modulo 2 data value (b(i)), of a counterpart one of N other blocks.

An Array Data Rebuild for Up to Three DASD Failures

Copending application Blaum et al (Blaum III), SA9-91-038, U.S. Ser. No.: 07/718,724, filed Jun. 21, 1991, "Error Correction Codes For Multiple Failures In Disk Arrays And The Like" is a code extension to that disclosed in Blaum I. Relatedly, the Blaum III method steps include parity coding and writing an (M–1)*(M–3) data block array onto a synchronous M DASD array, predetermined ones of the DASDs being reserved for storing parity; and responsive to the unavailability of up to three DASDs, rebuilding the data by repeating the coding step using data from the M–3 available DASD's on a scheduled or opportunistic basis and rewriting the rebuilt data onto spare capacity.

In Blaum III, the coding (either encoding or rebuilding) of the (M–1)*M block array includes following a traverse emulating the positively sloped motions of a chess rook, bishop, and knight extended cyclically over the data array such that the logically combined (XOR'ed) values over the traverses sum to zero. Blaum III is extensible to recovery from more than three DASDs by modification of the metaphoric knight's code traverse to include increasingly steeper slopes.

The Two Meanings of Parity or Redundancy Group

As used in the above identified Dunphy patent, "parity group" denotes a logical association of N DASDs including at least a (N+1)-st DASD dedicated to storing parity taken there across. However, the term also refers to a logical association of data blocks and a parity or other algebraic coded redundant block taken there across. Patterson uses the latter definition in discussion of the RAID type 5 DASD array.

Data Error and Erasure

"Data error" means any change in stored value as a consequence of a random noise or burst process. In systems storing binary values such as 1 1 1 0 0 1 0 0 , remanent magnetization states change such that some 1's become 0's and some 0's become 1's. This might appear as 1 1 0 0 0 1 0 1. Here, the values in the 3rd and 8th positions from the left are random errors.

"Erasure" is an error for which the error location is known but the error magnitude is NOT known. That is, an erasure is the removal of any data value in a storage location. For example, the data string 1 x x x x 1 0 0 omits any binary values in positions 2 through 5.

SUMMARY OF THE INVENTION

It is accordingly an object of this invention to devise a method and means for enhancing the availability of a DASD array in the presence of data errors, erasures, and DASD failures.

It is yet another object of this invention to devise a method and means for coding and rebuilding the data contents of up to two unavailable (i.e. erased) DASDs out of an array of M DASDs without propagating error such as is the case with convolutional codes and without executing complex operations over algebraic fields as found in Reed-Solomon type codes.

It is a related object that such method and means permit use of short write operations in higher level RAID arrays especially of the RAID 5 type.

The method and means of the invention rely upon generating a (M–1)*M block array from an (M–1)*(M–2) data block array using non-recursive simple parity coding over the data array independently in row major and diagonal major order, M being a prime number, and the diagonals taken with a toroidal topology. The parity value of each array diagonal is of the same mode (odd or even) as that of a reference major diagonal, and the parity mode of each row is even. Relatedly, the diagonal parity values form an (M–1)th array column while the row parity values form an M-th array column. The array columns are numerated from 0 to M–1. Simple parity coding means the XOR'ing of the data blocks in the diagonal or row traverse.

In the event that at least one DASD becomes unavailable, the data block array is rebuilt by simple parity coding of the referenced array elements from M–1 or M–2 available DASD's in the manner expressed above on a scheduled or opportunistic basis and writing the portions of the data block array formerly resident on the failed DASD onto spare DASD array capacity either as spare space reserved among the available DASDs or as hot spare DASDs substituting for the failed DASDs. In rebuilding, the parity mode of the reference diagonal is taken as odd if the parity of the (M–1)-th DASD does not equal the parity of the M-th DASD.

The term "non-recursive" means that the computation of either a row or diagonal parity occurs only over data blocks in any given row or diagonal traverse and does NOT include or take into account the parity value of any other row or diagonal traverse.

Such non-recursive parity coding is advantageous for short write operations. Short write operations involve modification of at least one data block and its associated parity. That is, in RAID 5 type of DASD array, short write operations would access, alter, and usually rewrite in place only the data block to be modified and both diagonal and a row parity values. This requires three read and three write operations per update transaction. These are one read operation each for the old data block and for the associated diagonal and row parity values and one write operation each for the new or recalculated values. The new diagonal parity is the XOR of the old diagonal parity, old data block, and the new data block while the new row parity is the XOR the old row parity, old data block, and the new data block.

There is one caveat, however, and that is, if the data block to be updated lies ON THE MAIN OR REFERENCE DATA BLOCK ARRAY DIAGONAL, then the method must be altered. As my be recalled, the one recursive effect in the coding method of the invention is the step of ascertaining the parity mode (odd/even) of the main or reference diagonal.

This mode governs the assignment of parity values for the remaining diagonals. In order to take this into account, the method involving short writes is modified such that each of the M diagonal parity values in the array is read, recalculated, and rewritten to taken as the XOR of the old parity value for the given diagonal, the old data block, and the new data block. The old and new data blocks are the same for each of the diagonal parity recalculations. Alternatively, the diagonal parity values may in this case also be determined as the logical complement of the old counterpart parity values.

DESCRIPTION OF THE PREFERRED EMBODIMENT

An Overview of Reading and Writing to the DASD Array

Figure 1:
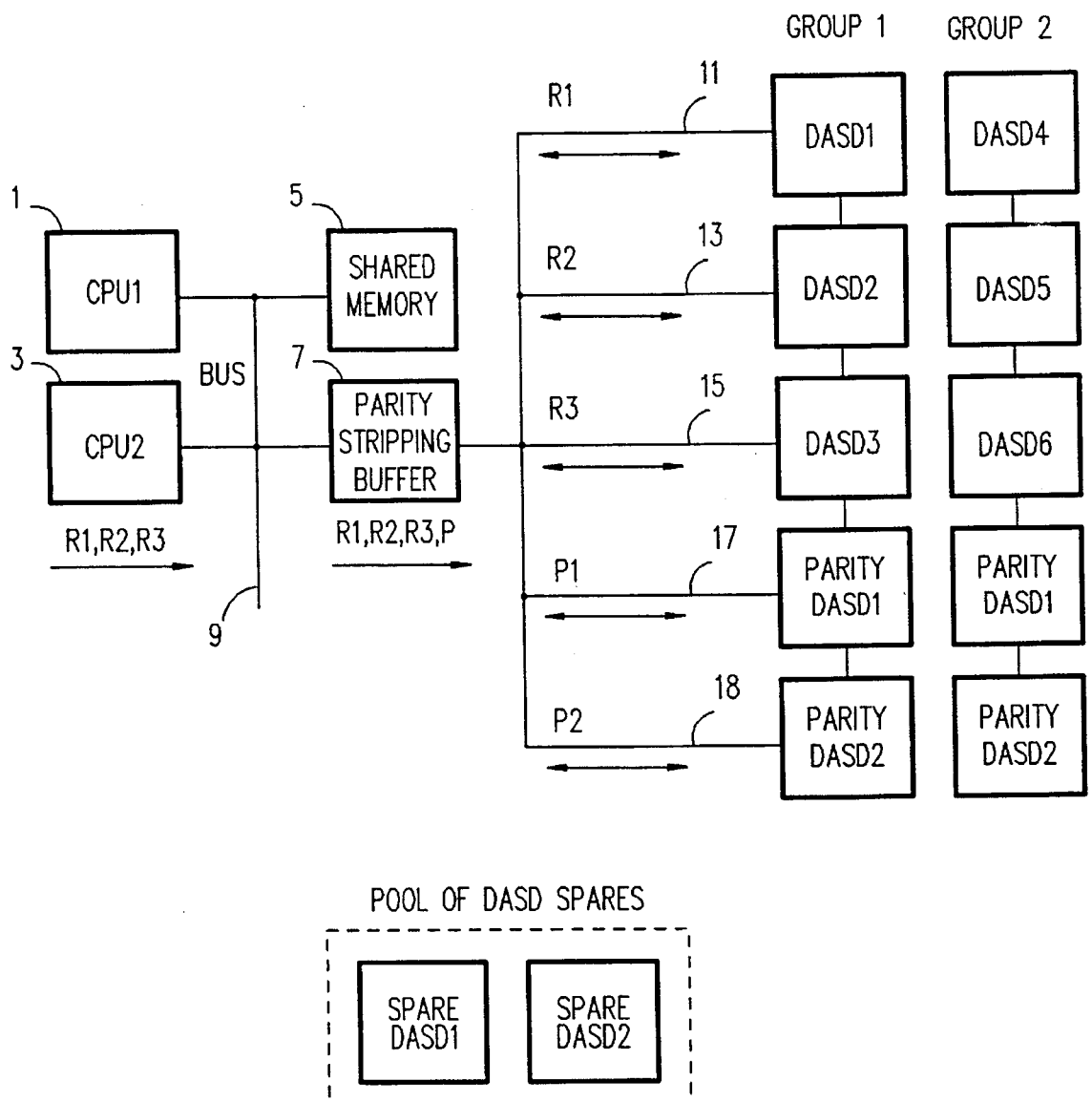
FIG. 1 shows a higher level RAID DASD array illustrating striping, parity encoding, sparing, and data redo on spares.

Referring now to FIG. 1, there is shown an array comprising a first and second DASD parity group coupling an intelligent parity generating and striping buffer (PSB) 7 over parallel paths 11, 3, 15, and 17. A processor array formed from CPU1 and CPU2 is coupled to data and control bus 9.

Processor 1 or 3 originated read and write commands establish a table directed access path to a group of DASDs (GROUP 1 or 2) by way of a standard accessing protocol and data movement over bus 9 shared memory 5 to PSB 7. The logical processing of a logical files is executed at PSB 7 In this regard, logical processing includes both striping (serial/parallel conversion of data) and parity generation and checking. The paths to and from the DASDs are table directed. In principle, an address specified in a read or write argument is translated by the PSB 7 via an array storage address table into the actual physical path between PSB 7 and the location on the DASDs of the requisite group of DASDs. For purposes of this invention, a group such as DASDs forming GROUP 1 will be considered as an array of M DASDs. Additional DASDs as "hot spares" are also available for inclusion into the array upon failure of up to tow of the M array DASDs. This is described for instance in Dunphy et al, U.S. Pat. No. 4,914,656.

To execute a write update command, PSB 7 must first buffer the new data block from the processor, read and buffer the old data block, and in the case of this invention, two parity blocks stored on the M DASD array. A new diagonal and row parities are computed taking the old data, old parity, and new data into account, and then the new data block and new parities are recorded in place on the counterpart array DASDs.

For a read operation, PSB 7 responsive to a read command from a processor performs inverse operation sequence to that of writing. That is, the data array within which the data to be read must be extracted is buffered in PSB 7, appropriate row and diagonal parities tested, and the addressed data transferred across bus 9 to shared memory 5.

DASD Failure and Hot Sparing

In the event that a DASD failure occurs while read accessing data, PSB 7 can select one from a number of alternatives. These include regenerating corrupted data on-the-fly either by either (1) retry of the read command or (2) reconstruction of the data from remaining DASDs and replacement according to the method of the invention.

With respect to the processor 1 or 3 originating the read command, one strategy is to notify it of the failure occurrence only AFTER completion of the read data movement. This would permit the processor to control substitution of a spare DASD from a pool or from a DASD reserved exclusively to each parity group in the manner of Park et al. Responsive to processor commands such as DISABLE and RECONSTRUCT, PSB 7 can cause the failed DASD to be replaced with a designated spare DASD by table substituting the directory path to the spare for the table directory path of the failed DASD. Next, the data on the failed DASD can be rebuilt on the designated spare DASD.

In one embodiment, PSB 7 stores a bit map of DASD availability and address map of the DASDs. In turn, the availability and address maps are referenced during the processing of each access command. Alterations to the maps may be originated by the processor using the DISABLE and RECONSTRUCT commands. In such an implementation, a permanent address is assigned to the e SPARE DASD. Significantly, after failure notification, the processor 1 or 3 can address map of the DASDs. In turn, the availability and address maps are referenced during the processing of each access command. Alterations to the maps are originated by the processor using the DISABLE and RECONSTRUCT commands. The present implementation assigns a permanent address to the SPARE DASD.

Significantly, after failure notification, the processor can (1) elect to do nothing; OR (2) generate commands causing the addresses of the spare DASDs to be substituted for the addresses for up to two of the failed DASDs; AND (3) reconstruct the contents of up to two failed DASD on the assigned spares by modulo 2 addition of parities plus remaining DASDs storing data blocks according to the reconstruction method set out below.

Note, the dynamic substitution of a spare formatted DASDs for other DASDs on-line is termed "hot sparing".

Flow Diagram of the Method of the Invention

Figure 2:
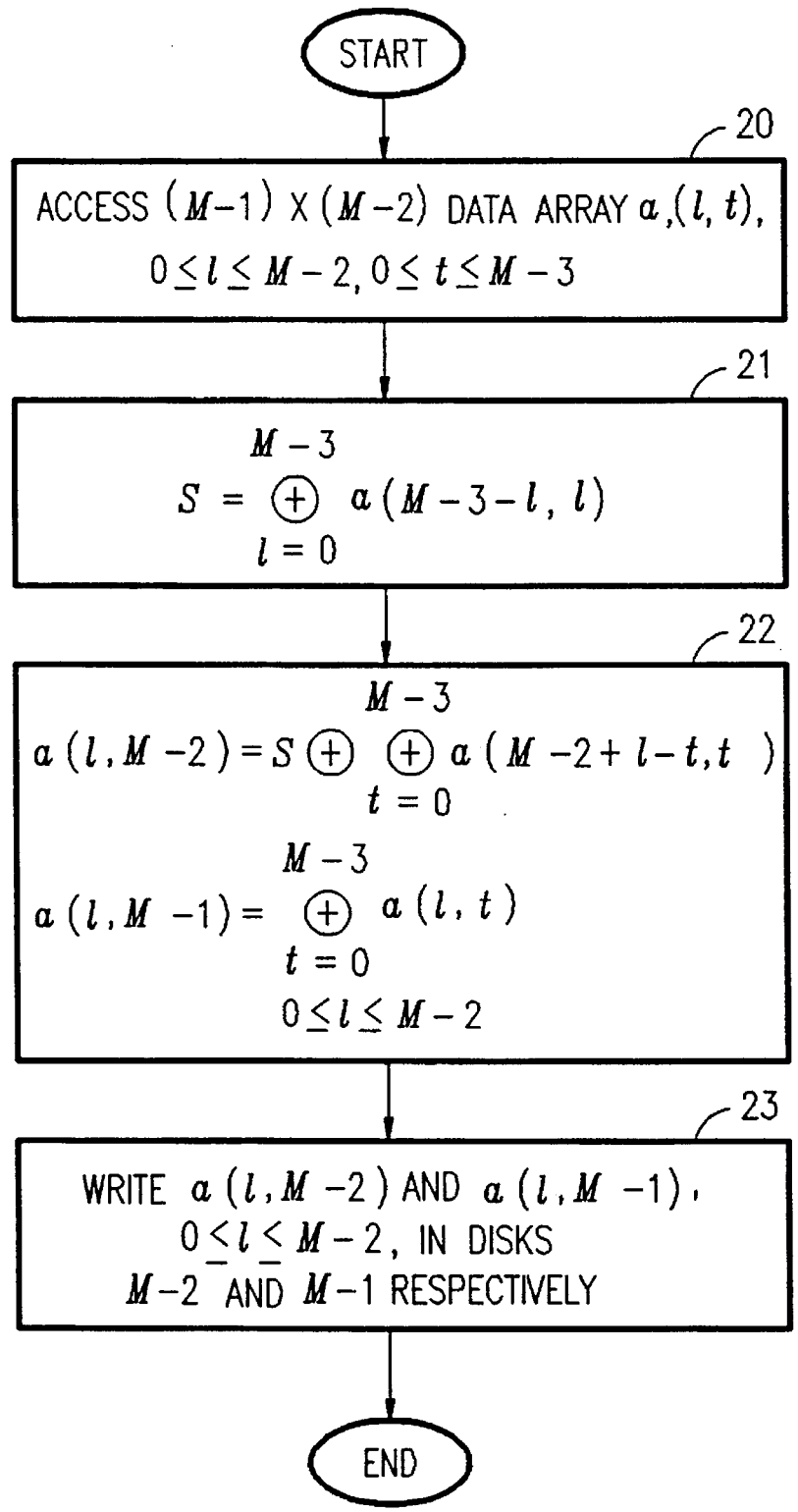
FIG. 2 sets forth the control flow for non-recursive simple parity coding elements of an (M–1)*(M–2) data block array in diagonal major and row major order.
Figure 3:
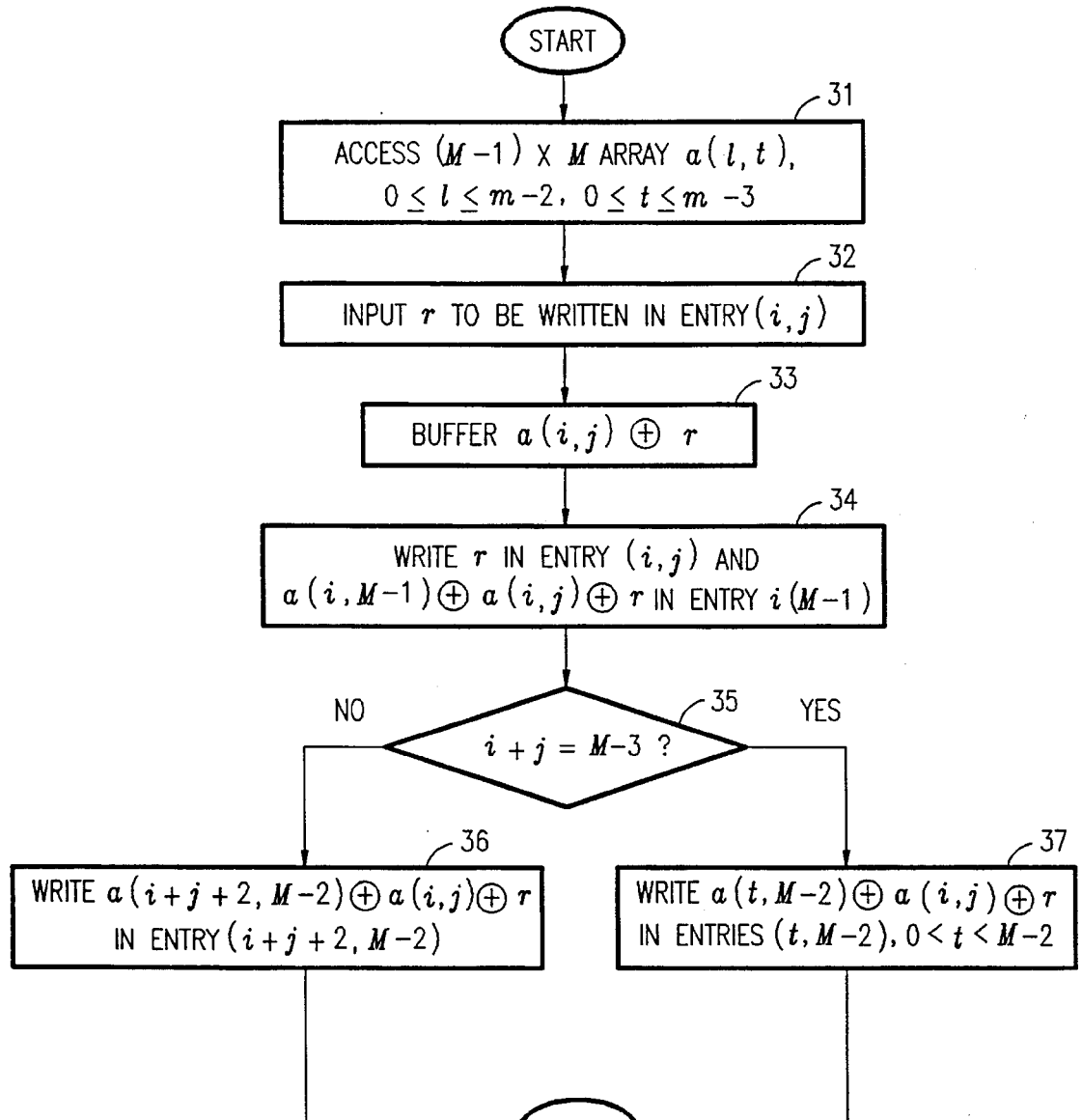
FIG. 3 illustrates the control flow for non-recursive simple parity coding elements of an (M–1)*M data block array in diagonal major and row major order for execution of short write operations.
Figure 4A:
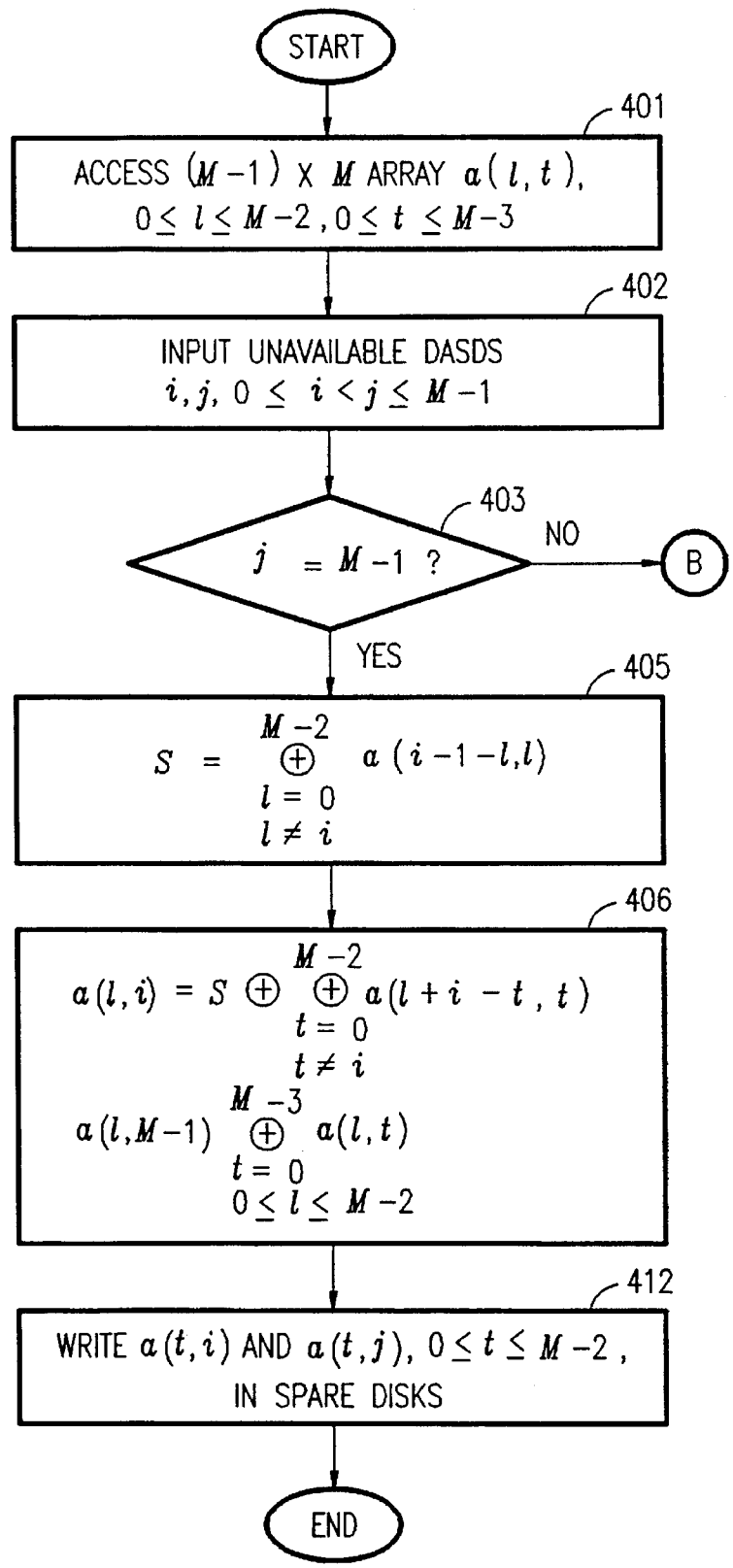
FIGS. 4a, 4b, 4c depict control flow for data rebuild in the event of up to two DASD failures.
Figure 4B:
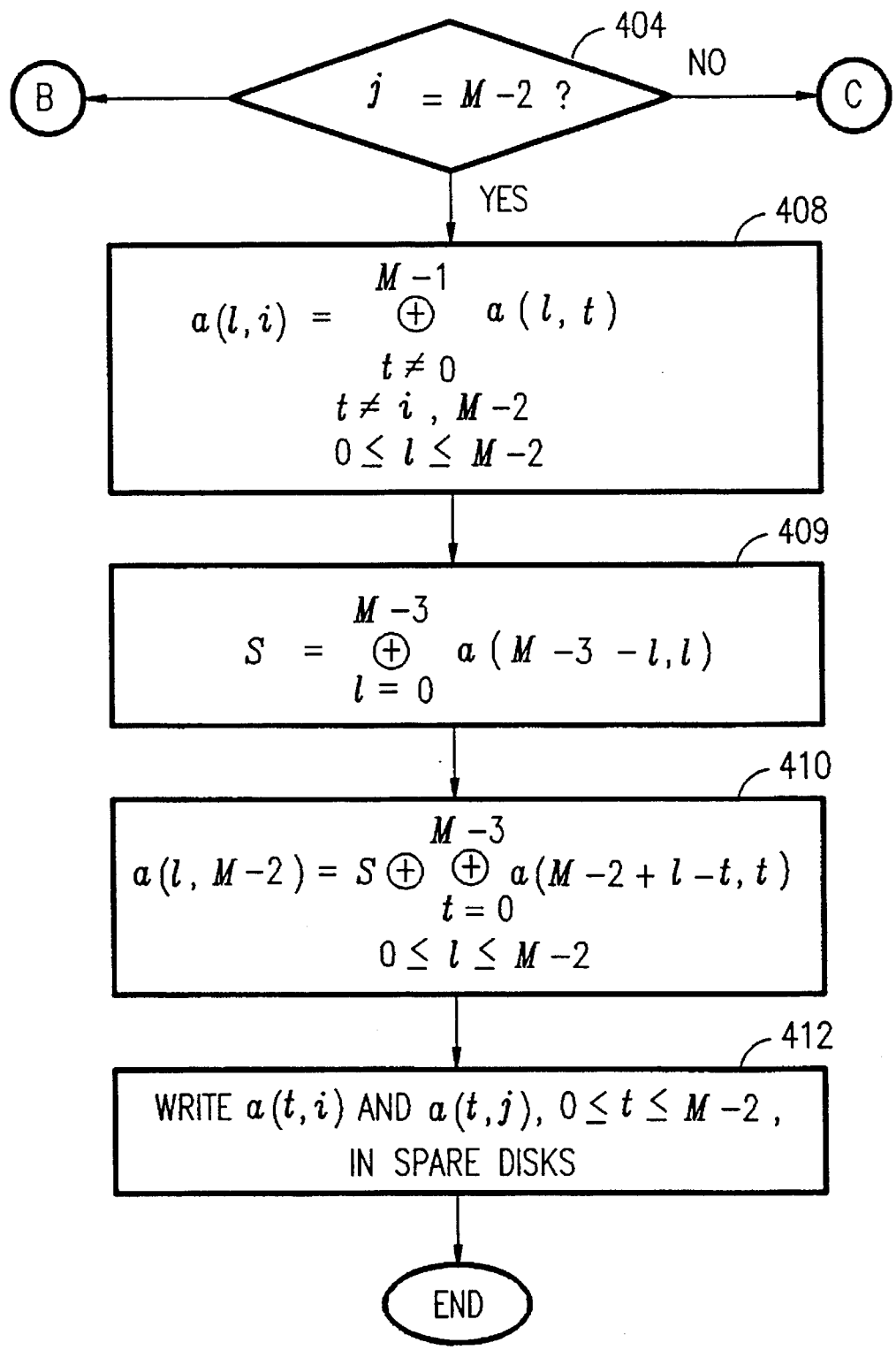
Figure 4C:
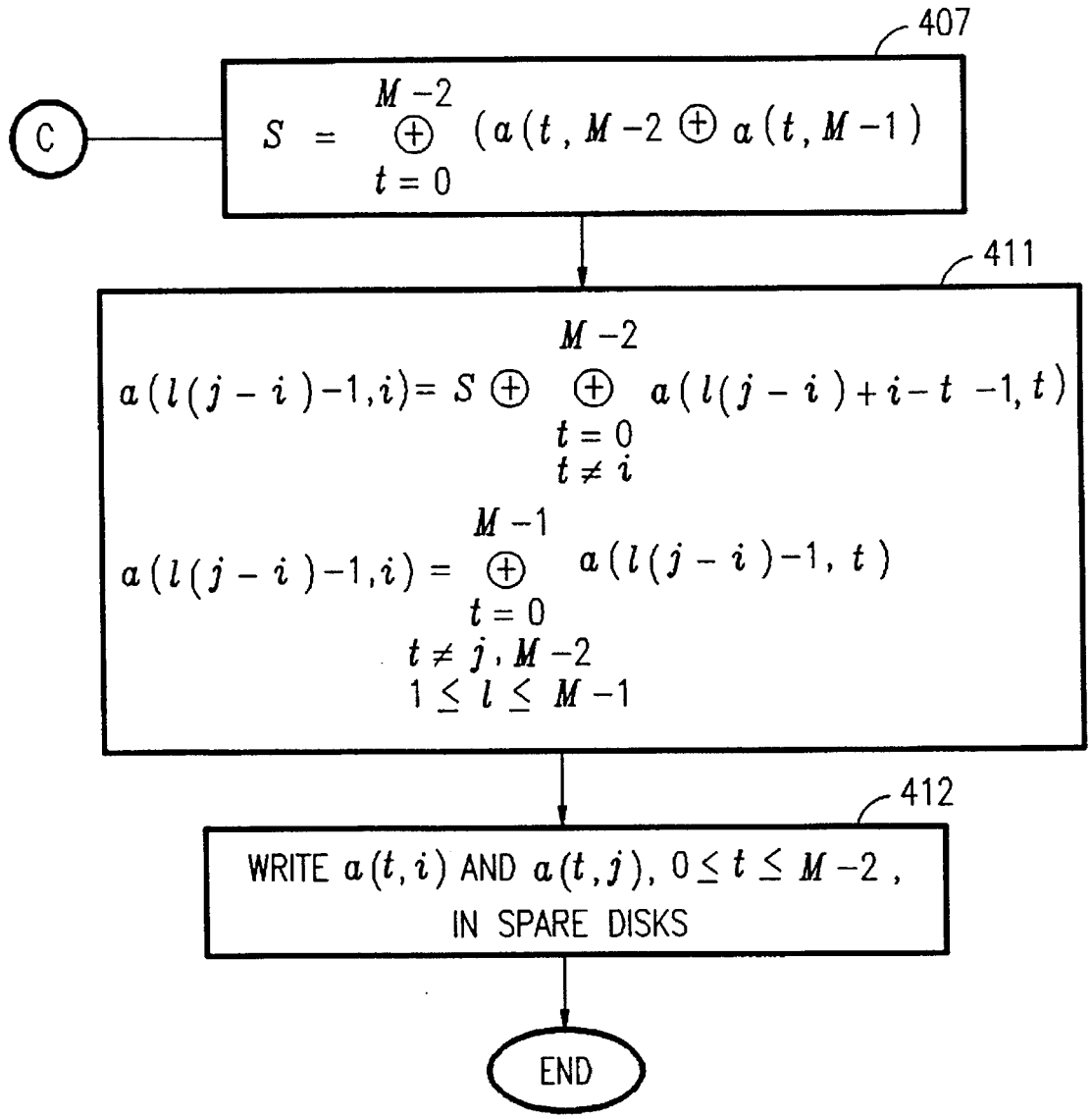

Referring now to FIGS. 2, 3 and 4, there is shown the control flow for non-recursively simple parity coding elements of an (M–1)*M data block array in diagonal major and row major order for execution of short write operations and responsiveness in the event of DASD failure or erasure. That is, data blocks projected onto a logical array in the form of rows and columns can have redundancy values calculated over predetermined traverses or subsets of data blocks such as diagonals and rows of the array. The redundancy values are then stored on either additional DASDs or on space reserved on the array DASDs. Portions of the data resident on up to two unavailable DASDs may be rebuilt using the parity values and then rewritten to spare DASDs or to reserved spare space among the M–2 remaining DASDs.

In this invention, the term "encoding" means the computation of a redundancy value over a predetermined subset of data blocks. The term "rebuilding" means the calculation of either a data block or a parity block by the same process as the redundancy computation using a subset of data blocks and redundancy values. The term "XOR" means the exclusive OR operation operating over a binary field.

The method of this invention eliminates recursions in the encoding and short write operations, replacing them with simple parity checks of data, i.e., a row and diagonal parity checks. The short write operation is simplified since any modified data block affects only two redundancy (parity) values most of the time.

This invention assumes an array of M DASDs where M is a PRIME number. Data blocks are arranged in a logical (M−1)*M array such that if a(i,j) is the ith block stored on the jth DASD. i lies in the closed interval [0, M−2] and j lies in the closed interval [0, M−1]. The requirement that M is a prime number is not really a limitation, since in case that less than M DASDs are needed, the code can always be shortened by assuming that an adequate number of (fictitious) DASDs store only zeros.

Data blocks are stored on the first M−2 DASDs while the parity values are stored on the (M−1)-th and M-th DASDs. Alternatively, parity values could be distributed across the DASD array such as described in Mattson I and II.

The parity values assume that the blocks a(M−1,j)=0 where j lies in the interval [0, M−1]. In other words, a (fictitious) all-zero row is assumed. In FIGS. 2, 3 and 4, it is also assuming that all the sub indices are taken modulo M.

Next the encoding is explicitly described, short write operations and reconstruction (decoding) whose equations are given in FIGS. 2, 3 and 4.

Encoding

The encoding is described in FIG. 2. The values of the redundancy a(t,M−2) and a(t,M−1) are given in box 22, where t lies in the interval [0,M−2]. The value S of the parity of the special diagonal (M−3,0), (M−4,1), ..., (0,M−3) is previously calculated in box 21. This value of S determines the parity of all the other diagonals, either odd or even. Explicitly, from a procedural view, the parity of the diagonal (M−3,0), (M−4,1), ..., (0,M−3) is taken as the mode governing the parity of the remaining diagonals taken in diagonal major order. If the data blocks sited along this major or reference diagonal exhibit an even number of 1's, then even parity governs the remaining diagonals. The parity of the rows is always taken as even. It should be noted that the binary case is illustrated, but the block symbols can belong to any alphabet.

The writing operation of the values estimated in box 22 is done in box 23.

Short Write Operations

By a short write operation, a data block a(i,j) is replaced where i lies in the interval [0,m−2] and j lies in the interval [0,m−3], by another arbitrary data block r. This operation will affect the redundant blocks. Most of the time, only two redundant blocks will have to be modified, except when the data block a(i,j) being rewritten lies in the reference diagonal (M-3,0), (M-4,1), ..., (0,M-3). In this case, all the diagonal parities will have to be modified. The horizontal parity is modified as in the previous case. None of these two cases involves recursions.

The (M−1)×M array is accessed in box 31. Box 32 receives the input r of the value that will replace a(i,j). Box 33 executes and buffers the operation a(i,j) XOR r. In box 34, the actual operation of writing r in location (i,j) and a (i,m−1) XOR a (i,j) XOR r in location (i,m−1) is implemented. Box 35 checks if entry (i,j) lies in the reference diagonal (M−3,0), (M−4,1), ..., (0,M−3). If it does not, then, in box 36, the operation of writing a(i+j+2,m−2) XOR a(i,j) XOR r in entry (i+j+2,m−2) is implemented. If it does, then, in box 37, the operation of writing a (s,m−2) XOR a (i,j) XOR r in entries (s,m−2) for each s in the interval [0,M−2] is implemented.

Decoding (Reconstruction)

This step allows us to reconstruct the content of any two unavailable DASDs from the remaining M−2 DASDs.

The (M−1)×M array is accessed in box 401. In box 402, the input i and j of the two unavailable DASDs is received, where i<j, i and j lie in the interval [0,M−1]. Box 403 checks if j is M−1, i.e., the DASD containing the horizontal redundancy. If it is, then the parity of the diagonals is estimated in box 405 (odd or even), as in the encoding operation. Then, the values of the missing entries a(t,i) and a(t,M−1) are estimated in box 406, where t is in the interval [0,M−2]. The reconstructed values are written in spare disks replacing the unavailable DASDs i and M−1 in box 412. Notice that in the particular case in which i=M−2, then the encoding equations of FIG. 2 are again obtained. In that sense, the encoding is a particular case of the decoding.

If the answer from box 403 is no, then box 404 checks if j is M−2, i.e., the DASD containing the diagonal redundancy. If the answer is yes, then the first step is retrieving the entries a(t,i), where t lies in the interval [0,M−2]. This is done in box 408 using the horizontal parities a(t,M−1). Once the entries a(t,i) are recovered, the diagonal parity S in box 409 is estimated. Then, in box 410, the diagonal parities a(t,M−2), t in the interval [0,M−2] are obtained. The reconstructed values are written in spare disks replacing the unavailable DASDs i and M−2 in box 412.

If the answer to box 404 is no, then we are in the main case, that is, two DASDs i and j carrying data blocks are unavailable. None of the redundant DASDs is affected. In box 407, the diagonal parity is determined, by exclusive-OR (XOR'ing) all the redundant symbols a(t,M−2) and a(t,M−1). Then, the data lost in DASDs i and j are retrieved in box 411. Notice that the operations in box 411 are a recursion. The index 1 runs from 1 to M−1. The entries are retrieved in the order indicated in box 411, starting with l=1 and ending with l=M−1. So, a recursion at the decoding is needed, but only in the event of a double disk failure, which is not very frequent. As before, the reconstructed values are written in spare DASDs replacing the unavailable DASDs i and j in box 412.

In the next section examples of the encoding are given, short write operations and decoding described in FIGS. 2, 3 and 4.

Illustrative Examples

Encoding

Assume that it is desired to store data blocks on an array of M=5 DASDs. Let the data and parity blocks and values be denoted by a (i,j) where i lies in $\bar{0}0,3\bar{a}$ and j lies in $\bar{0}0,4\bar{a}$. The parity S of the data blocks taken along the reference diagonal (M−3,0), (M−4,1), ... (0,M−3), according to box 21 in FIG. 2, would be expressed as:

$$S=a(2,0) \text{ XOR } a(1,1) \text{ XOR } a(0,2).$$

Using the equations in box 22 of FIG. 2, it follows that the M−2 diagonal parity values to be stored on the (M−1)-th DASD can be determined according to:

$$a(0,3)=a(3,0) \text{ XOR } a(2,1) \text{ XOR } a(1,2) \text{ XOR } S$$

$$a(1,3)=a(3,1) \text{ XOR } a(2,2) \text{ XOR } S$$

$a(2,3)=a(0,0)$ XOR $a(3,2)$ XOR $S$ $a(3,3)=a(1,0)$ XOR $a(0,1)$ XOR $S$

The M−1 row parity values stored in the Mth DASD are formulated per:

$a(i,4)=a(i,0)$ XOR $a(i,1)$ XOR $a(i,2)$ where $i$ lies in $\overline{0,3a}$.

Assume that the (M−1)*(M−2) data block matrix to be parity coded is (for ease of illustration a data block is taken everywhere to be 1 bit in length):

| | | |
|---|---|---|
| 1 | 0 | 1 |
| 0 | 1 | 1 |
| 1 | 1 | 0 |
| 0 | 1 | 0 |

Using the equations above, $S=a(2,0)$ XOR $a(1,1)$ XOR $a(0,2)=1$ XOR $1$ XOR $1=1$ or odd parity.

$a(0,3)=a(3,0)$ XOR $a(2,1)$ XOR $a(1,2)$ XOR $S=0$ XOR $1$ XOR $1$ XOR $1 =1$ $a(1,3)=a(3,1)$ XOR $a(2,2)$ XOR $S=1$ XOR $0$ XOR $1=0$ $a(2,3)=a(0,0)$ XOR $a(3,2)$ XOR $S=1$ XOR $0$ XOR $1=0$ $a(3,3)=a(1,0)$ XOR $a(0,1)$ XOR $S=0$ XOR $0$ XOR $1=1$ $a(0,4)=a(0,0)$ XOR $a(0,1)$ XOR $a(0,2)=1$ XOR $0$ XOR $1=0$ $a(1,4)=a(1,0)$ XOR $a(1,1)$ XOR $a(1,2)=0$ XOR $1$ XOR $1=0$ $a(2,4)=a(2,0)$ XOR $a(2,1)$ XOR $a(2,2)=1$ XOR $1$ XOR $0=0$ $a(3,4)=a(3,0)$ XOR $a(3,1)$ XOR $a(3,2)=0$ XOR $1$ XOR $0=1$

The final encoded version looks as follows:

| DASD0 | DASD1 | DASD2 | DASD3 Diag. P. (odd) | DASD4 Hor. P. (even) |
|---|---|---|---|---|
| 1 | 0 | 1 | 1 | 0 |
| 0 | 1 | 1 | 0 | 0 |
| 1 | 1 | 0 | 0 | 0 |
| 0 | 1 | 0 | 1 | 1 |

Short Write Operations As Facilitated By the Invention

Assume that M=5 and the following (M−1)*M data block array is stored across the M DASDs.

| DASD0 | DASD1 | DASD2 | DASD3 | DASD4 |
|---|---|---|---|---|
| 0 | 0 | 0 | 0 | 0 |
| 1 | 1 | 0 | 1 | 0 |
| 0 | 1 | 1 | 1 | 0 |
| 0 | 1 | 0 | 0 | 1 |

Suppose that we want to replace $a(0,1)=0$ by $a(0,1)=1$. Since entry (0,1) does NOT lie on the reference diagonal defined along (2,0), (1,1), (0,2), then, according to FIG. 3, only three reads and three writes are required to effectuate the write update. That is, only the data $a(0,1)$, the diagonal parity $a(3,3)$ and the row parity $a(0,4)$ need to be changed. As is apparent, if we change $a(0,1)=1$, then $a(3,3)=1$ to maintain odd diagonal parity and $a(0,4)=1$ to keep even row parity. The new array is then

| DASD0 | DASD1 | DASD2 | DASD3 | DASD4 |
|---|---|---|---|---|
| 0 | 1 | 0 | 0 | 1 |
| 1 | 1 | 0 | 1 | 0 |
| 0 | 1 | 1 | 1 | 0 |
| 0 | 1 | 0 | 1 | 1 |

Now, assume that given the array above, it is desired to set $a(1,1)=0$. Since it lies on the major diagonal, then all of the diagonal parities must be changed as well as the row parity $a(1,4)$. This gives the new array

| DASD0 | DASD1 | DASD2 | DASD3 | DASD4 |
|---|---|---|---|---|
| 0 | 1 | 0 | 1 | 1 |
| 1 | 0 | 0 | 0 | 1 |
| 0 | 1 | 1 | 0 | 0 |
| 0 | 1 | 0 | 0 | 1 |

Notice that the diagonal parity has switched from odd to even.

Reference should again be made to FIG. 3 for a flow diagram with a detailed description of short write operations.

Decoding

If one of the DASDs fails this is the same as a given column being erased. Thus, if the ith column or DASD were erased, then its contents could be recomputed by an XOR or the remaining columns or DASD in the same manner as the Ouchi patent. However, if two DASDs i and j concurrently fail or the columns are erased, i<j, i and j in the interval [0,M−1], then the problem must be resolved in the way described in FIG. 4.

Consider the array below.

| DASD0 | DASD1 | DASD2 | DASD3 | DASD4 |
|---|---|---|---|---|
| 0 | ? | 0 | 1 | ? |
| 1 | ? | 0 | 0 | ? |
| 0 | ? | 1 | 0 | ? |
| 0 | ? | 0 | 0 | ? |

The symbol "?" indicates that the information has been lost in the corresponding entry. In the example, we see that DASDs 1 and 4 are unavailable, i.e., i=1 and j=M−1=4. Now, implementing the decoding according to FIG. 4, box 403 sends us to box 405. There, we estimate $S=a(0,0)$ XOR $a(3,2)$ XOR $a(2,3)=0$ XOR $0$ XOR $0=0$ or even parity.

Then, in box 406, we estimate $a(t,1)$ and $a(t,4)$ as follows:

$a(0,1)=a(1,0)$ XOR $a(3,3)$ XOR $S=1$ XOR $0$ XOR $0=1$ $a(1,1)=a(2,0)$ XOR $a(0,2)$ XOR $S=0$ XOR $0$ XOR $0=0$ $a(2,1)=a(3,0)$ XOR $a(1,2)$ XOR $a(0,3)$ XOR $S=0$ XOR $0$ XOR $1$ XOR $0=1$ $a(3,1)=a(2,2)$ XOR $a(1,3)$ XOR $S=1$ XOR $0$ XOR $0=1$ $a(0,4)=a(0,0)$ XOR $a(0,1)$ XOR $a(0,2)=0$ XOR $1$ XOR $0=1$ $a(1,4)=a(1,0)$ XOR $a(1,1)$ XOR $a(1,2)=1$ XOR $0$ XOR $0=1$ $a(2,4)=a(2,0)$ XOR $a(2,1)$ XOR $a(2,2)=0$ XOR $1$ XOR $1=0$ $a(3,4)=a(3,0)$ XOR $a(3,1)$ XOR $a(3,2)=0$ XOR $1$ XOR $0=1$

Therefore, the reconstructed DASD is

| DASD0 | DASD1 | DASD2 | DASD3 | DASD4 |
|-------|-------|-------|-------|-------|
| 0 | 1 | 0 | 1 | 1 |
| 1 | 0 | 0 | 0 | 1 |
| 0 | 1 | 1 | 0 | 0 |
| 0 | 1 | 0 | 0 | 1 |

Similarly, assume now that the following array is received:

| DASD0 | DASD1 | DASD2 | DASD3 | DASD4 |
|-------|-------|-------|-------|-------|
| ? | 1 | 0 | ? | 1 |
| ? | 0 | 0 | ? | 1 |
| ? | 1 | 1 | ? | 0 |
| ? | 1 | 0 | ? | 1 |

Therefore, DASDs i=0 and j=3 are unavailable. Since j=M−2, box 404 takes us to box 408, where the a(t,0)'s are estimated as follows:

$a(0,0)=a(0,1)$ XOR $a(0,2)$ XOR $a(0,4)=1$ XOR $0$ XOR $1=0$ $a(1,0)=a(1,1)$ XOR $a(1,2)$ XOR $a(1,4)=0$ XOR $0$ XOR $1=1$ $a(2,0)=a(2,1)$ XOR $a(2,2)$ XOR $a(2,4)=1$ XOR $1$ XOR $0=0$ $a(3,0)=a(3,1)$ XOR $a(3,2)$ XOR $a(3,4)=1$ XOR $0$ XOR $1=0$

We next go to box 409, where the diagonal parity is estimated as follows:

$S=a(2,0)$ XOR $a(1,1)$ XOR $a(0,2)=0$ XOR $0$ XOR $0=0$ or even parity.

Finally, in box 410, the symbols in DASD3 are estimated as follows:

$a(0,3)=a(3,0)$ XOR $a(2,1)$ XOR $a(1,2)$ XOR $S=0$ XOR $1$ XOR $0$ XOR $0=1$ $a(1,3)=a(3,1)$ XOR $a(2,2)$ XOR $S=1$ XOR $1$ XOR $0=0$ $a(2,3)=a(0,0)$ XOR $a(3,2)$ XOR $S=0$ XOR $0$ XOR $0=0$ $a(3,3)=a(1,0)$ XOR $a(0,1)$ XOR $S=1$ XOR $1$ XOR $0=0$

The final result of the decoding is then

| DASD0 | DASD1 | DASD2 | DASD3 | DASD4 |
|-------|-------|-------|-------|-------|
| 0 | 1 | 0 | 1 | 1 |
| 1 | 0 | 0 | 0 | 1 |
| 0 | 1 | 1 | 0 | 0 |
| 0 | 1 | 0 | 0 | 1 |

Assume now that the following array is received:

| DASD0 | DASD1 | DASD2 | DASD3 | DASD4 |
|-------|-------|-------|-------|-------|
| ? | 1 | ? | 1 | 1 |
| ? | 0 | ? | 0 | 1 |
| ? | 0 | ? | 1 | 0 |
| ? | 1 | ? | 0 | 1 |

Therefore, DASDs i=0 and j=2 have been erased. Now, since j=2<3=M−2, box 404 takes us to box 407. There, the diagonal parity is estimated as follows:

$S=a(0,3)$ XOR $a(0,4)$ XOR $a(1,3)$ XOR $a(1,4)$ XOR $a(2,3)$ XOR $a(2,4)$ XOR $a(3,3)$ XOR $a(3,4)=1$ XOR $1$ XOR $0$ XOR $1$ XOR $1$ XOR $0$ XOR $0$ XOR $1=1$.

Now the final recursion in box 411 can be determined:

$a(1,0)=a(0,1)$ XOR $a(3,3)$ XOR $S=1$ XOR $0$ XOR $1=0$ $a(1,2)=a(1,0)$ XOR $a(1,1)$ XOR $a(1,4)=0$ XOR $0$ XOR $1=1$ $a(3,0)=a(2,1)$ XOR $a(1,2)$ XOR $a(0,3)$ XOR $S=0$ XOR $1$ XOR $1$ XOR $1=1$ $a(3,2)=a(3,0)$ XOR $a(3,1)$ XOR $a(3,4)=1$ XOR $1$ XOR $1=1$ $a(0,0)=a(3,2)$ XOR $a(2,3)$ XOR $S=1$ XOR $1$ XOR $1=1$ $a(0,2)=a(0,0)$ XOR $a(0,1)$ XOR $a(0,4)=1$ XOR $1$ XOR $1=1$ $a(2,0)=a(1,1)$ XOR $a(0,2)$ XOR $S=0$ XOR $1$ XOR $1=0$ $a(2,2)=a(2,0)$ XOR $a(2,1)$ XOR $a(2,4)=0$ XOR $0$ XOR $0=0$

The final reconstructed array is:

| DASD0 | DASD1 | DASD2 | DASD3 | DASD4 |
|-------|-------|-------|-------|-------|
| 1 | 1 | 1 | 1 | 1 |
| 0 | 0 | 1 | 0 | 1 |
| 0 | 0 | 0 | 1 | 0 |
| 1 | 1 | 1 | 0 | 1 |

Figure 5:
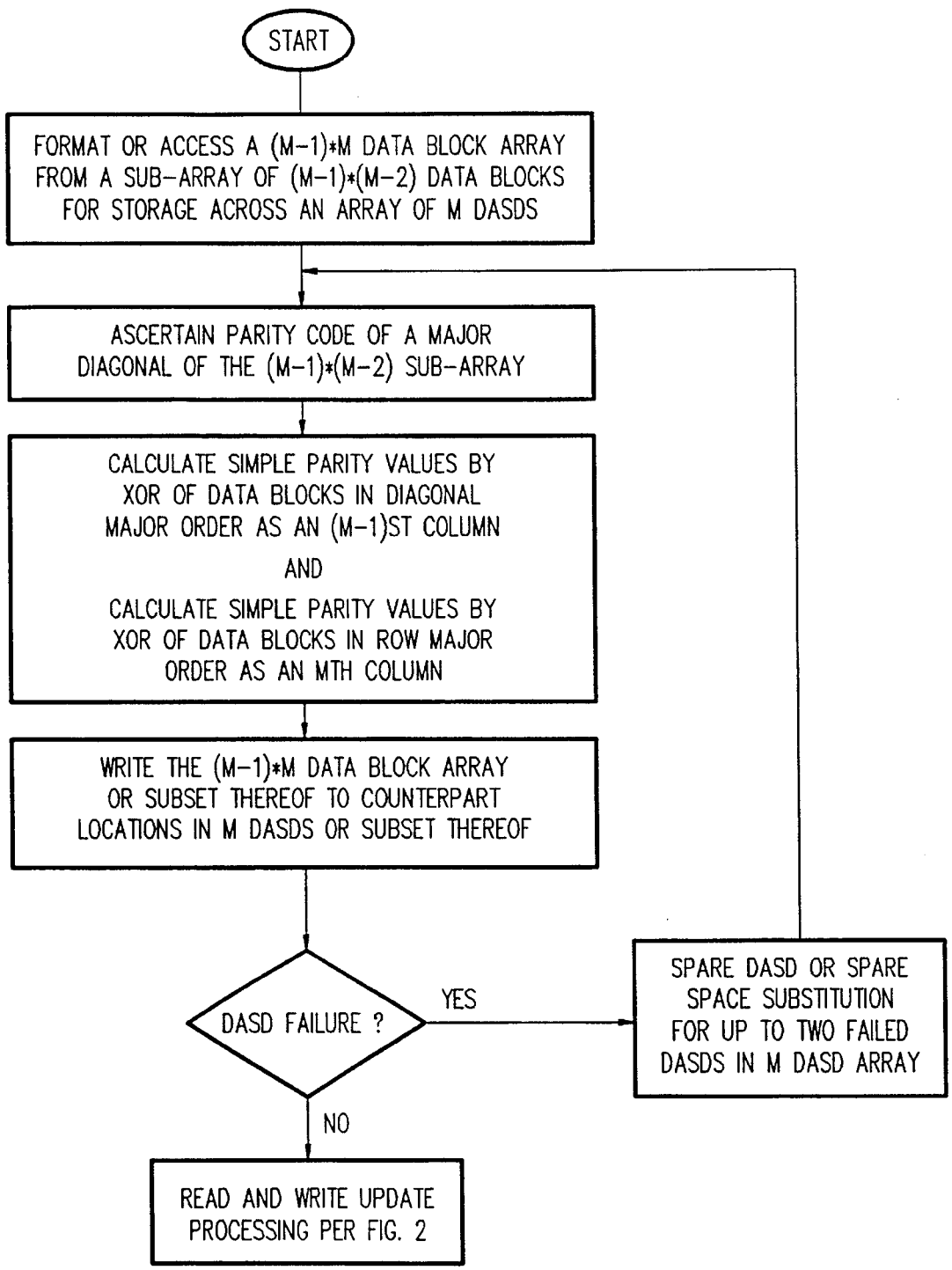
FIG. 5 shows a high level control flow for parity coding and rebuilding information in the event that up to two DASDs become concurrently unavailable.

Referring now to FIG. 5, there is shown a high level flow diagram of the method of the invention. A (M−1)*M data block array is written across an M DASD array, parity mode of a reference diagonal ascertained, parity values calculated in diagonal major order and in row major order, the data array and parities written to the DASD array, and a reiteration of the steps occurs in recovery only in the event of a DASD failure.

These and other extensions of the invention may be made without departing from the spirit and scope thereof as recited in the appended claims.

We claim:

1. A method for encoding and rebuilding of any data contents of up to two unavailable direct access storage devices (DASD's) from an array of M failure independent DASDs and a plurality of DASDs operative as spares to said array of M failure independent DASDs and where a two DASD equivalent of spare space is distributed over said M failure independent DASDs, M being a prime number, said data contents being expressed as an (M−1)*(M−2) data block array, the blocks in each row of the data array being stored in counterpart ones of the DASDS forming the array of M failure independent DASDs, comprising the steps of:

(a) generating an (M−1)*M data block array from the (M−1)*(M−2) data block array by calculating non-recursive simple parity values over diagonal and row traverses of the (M−1)*(M−2) data block array, said parity values being calculated in respective diagonal major and row major order and being defined over a counterpart diagonal or row of said data block array, a parity mode (odd or even) of data blocks along a reference diagonal operating as a mode for calculating a parity value for non-reference diagonals, the parity value for each row being calculated according to an even mode;

(b) writing the blocks in each row of said (M−1)*M data array to counterpart ones of said M failure independent DASDs; and (c) responsive to the availability of up to two DASDs, rebuilding any portion of said data array from not less than (M−2) available DASDs and writing said rebuilt portion either to counterpart spare DASDs or to spare space available on no less than M−2 remaining DASDs.

2. In a system having a plurality of direct access storage devices (DASDs), a portion of said plurality of DASDs forming an array of M failure independent DASDs, said system further having means responsive to a source of external commands for accessing subsets of data blocks logically addressed in an (M−1)*(M−2) array of data blocks from said M failure independent DASDs, M being a prime number, said array of data blocks having a plurality of diagonals definable thereover, a predetermined one of said diagonals being designated as a major or reference diagonal, said data blocks being arranged in said array of data blocks in diagonal and row major order, each diagonal and row order of data blocks having a parity mode (odd or even), a method for encoding and rebuilding of contents of said array of data blocks in the event that up to two DASD's from the M failure independent DASD array become unavailable, comprising the steps of:

(a) ascertaining a parity mode of the major diagonal of data blocks in the (M−1)*(M−2) data block array;

(b) generating an (M−1)*(M−2) data block array from said (M−1)*M−2) data array by forming an (M−1)th column by calculating simple parity values from the data blocks in diagonal major order according to the parity mode of step (a) and by forming an M-th column by calculating simple parity values from the data blocks in row major order according to an even parity mode;

(c) writing said (M−1)*M data block array onto counterpart locations across the M failure independent DASD array or space equivalent in the event of DASD unavailability; and (d) responsive to the unavailability of up to two DASDs, rebuilding any portion of said data array from not less than (M−2) available DASDs.

3. The method according to claim 2, wherein step (d) includes writing said rebuilt portion either to counterpart ones of said plurality of DABDs operatively designated as spares or to spare space available on not less than M−2 remaining DASDs.

4. The method according to claim 2, wherein if M is not a prime number then causing steps (b), (c), and (d) to emulate a data block array expanded to include additional columns of uniform binary value to yield an effective array (M'−i)*M' where M' constitutes a prime number larger than M.

5. The method according to claim 2, wherein said method executes at least one small write access through said means for accessing said subsets of data blocks to the (M−1)*M data array stored on array of M DASDs, a first DASD and a second DASD of the M failure independent DASDs storing simple parity values while M−2 other DASDs of the M failure independent DASDs storing data blocks, and wherein said method further comprises the steps of:

(1) ascertaining whether a selected old data block to be updated to a new data block lies on a main or reference diagonal of the data block array;

(2) in the event that the old data block is not located on the main diagonal, then (a) reading the old data block from a DASD of the M−2 other DASDs storing said old data block and reading old diagonal and old row parity values from the first DASD and second DASD, respectively;

(b) determining a new diagonal parity value by XOR'ing the old data block, new data block, and old diagonal parity value, and determining a new row parity value by XOR'ing the old data block, new data block, and old row parity value; and (c) writing said new data block, and new diagonal and row parity values in place in the DASD of the M−2 other DASD and the first DASD and second DASD, respectively;

(3) in the event that the old data block is located on the main diagonal, then (a) reading the old data block from the DASD of the M−2 other DASDs storing said old data block, the old row parity value from the second DASD, and M diagonal parity values from the first DASD;

(b) determining each of M new diagonal parity values by XOR'ing an old counterpart diagonal parity value of the M diagonal parity values, the old data block and the new data block, and determining a new row parity value by XOR'ing the old data block, the new data block, and the old row parity value; and (c) writing said new data block, new row parity value, and M new diagonal parity values to counterpart ones of the M failure independent DASDs.

6. The method according to claim 5, wherein step (3)(c) further includes the step of writing said data blocks and parity values in place in said counterpart ones of the M failure independent DASDs.

7. In a system having a plurality of DASDs, said system including means for operatively accessing an integer number M of said plurality in a higher level redundant array of inexpensive disks (RAID) configuration, M being a prime number, said accessing means being responsive to a source of external commands for reading and writing of data blocks stored on selected ones of said M of said plurality of DASDs, said data blocks being arranged in a (M−1)*(M−2) logical array, said logical array being formed from (M−1) rows and (M−2) data blocks per row, each of the (M−2) data blocks in each of the (M−1) rows in said logical array being written across counterpart ones of the M−2 of the DASDs, ones of said plurality being designated as spares, a method comprising the steps of:

(a) ascertaining a parity mode of the data blocks distributed over a major diagonal of the logical array, the data blocks in the logical array also being ordered as a plurality of diagonals;

(b) generating an (M−1)*M logical array from the (M−1)*(M−2) logical array by forming a (M−1)st column of parity values by calculating a simple parity over each diagonal of said plurality of diagonals according to the parity mode of step (a) in a diagonal major order and by forming an M-th column of parity values by calculating the simple parity to over each row in row major order;

(c) writing the generated (M−1)*M logical array across the M DASDs;

(d) responsive to a write update command to modify a data block NOT located on the major diagonal of the logical array by reading the old data block, an old diagonal parity value, and an old row parity value, calculating a new diagonal and a new row parity value, and writing the modified data block and the new diagonal and row parity values in place among the M DASDs, and responsive to a write update command to modify a data block located on the major diagonal, repeating steps (a) and (b) with respect to generation of (M−1) new diagonal parity values and the new row parity value and writing the modified data block and new diagonal parities and new row parity in place among the M DASDs; and (e) responsive to unavailability of up to two DASDs, rebuilding a portion of said logical array from not less than (M−2) available DASDs and writing said rebuilt unavailable portion to counterpart ones of said plurality of DASDs operatively designated as spares.

8. The method according to claim 7, wherein said accessing means includes means for reserving spare space across M−2 DASDs of said M DASDs, and further wherein step (e) includes the step of writing said rebuilt unavailable portion to spare space available on not less than the M−2 of said M DASDs.

9. The method according to claim 7, wherein in step (d) the step of generation of the (M−1) new diagonal parity values responsive to the write update command to modify a data block located on the major diagonal further includes the step of logically complementing counterpart old diagonal parity values.

10. The method according to claim 7, wherein step (e) is modified such that (1) if two unavailable DASDs consist of the DASDs storing the diagonal parity and row parity values respectively on an (M−1)st DASD and on an Mth DASD, then repeating step (b) and writing the reconstituted row and parity values to spare DASD substitutes for the (M−1)st and Mth DASDs respectively, (2) if the two unavailable DASDs consist of an ith DASD storing data blocks and an Mth DASD storing row parity values, then reconstructing the ith DASD by ascertaining the parity mode of the major diagonal, calculating each data block of the ith DASD by XOR'ing only the data blocks lying along the diagonal intersecting the ith DASD according to the ascertained parity mode, and reconstructing the Mth DASD by calculating each row parity value by XOR'ing only the data blocks lying along the row intersecting the Mth DASD, and writing said calculated data blocks and row parity values to the spare DASD substitutes for the ith DASD and Mth DASD respectively, (3) if the two unavailable DASDs consist of the ith DASD storing data blocks and the (M−1)st DASD storing diagonal parity values, then reconstructing the ith DASD by calculating each data block of the ith DASD by XOR'ing each of any remaining data blocks and the row parity value intersecting the ith DASD, and reconstructing the (M−1)st DASD by ascertaining the parity mode of the major diagonal, calculating each diagonal parity value by XOR'ing the data blocks lying along the diagonal intersecting the (M−1)st DASD, together with said parity mode of the major diagonal, and writing said calculated data blocks and diagonal parity values to the spare DASD substitutes for the ith DASD and (M−1)st DASD respectively, and (4) if the two unavailable DASDs consist of a pair of DASDs (ith and jth DASDS) storing data blocks, then ascertaining the parity mode of the major array diagonal as being odd if the XOR of the diagonal parity values is not equal to the XOR of the row parity values and as being even otherwise, ascertaining each data block value in either the ith or jth DASD as an XOR solution to a single equation with a single unknown formed by either a diagonal of data blocks and diagonal parity value intersecting said each data block being calculated or a row of data blocks and row parity value intersecting said each data block being calculated, and writing said calculated data blocks to the spare DASD substitutes for the ith and jth DASDs.

* * * * *